(12) United States Patent
Cheng et al.

(10) Patent No.: US 10,050,107 B1
(45) Date of Patent: *Aug. 14, 2018

(54) NANOSHEET TRANSISTORS ON BULK MATERIAL

(71) Applicant: INTERNATIONAL BUSINESS MACHINES CORPORATION, Armonk, NY (US)

(72) Inventors: Kangguo Cheng, Schenectady, NY (US); Ruilong Xie, Schenectady, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/430,764

(22) Filed: Feb. 13, 2017

(51) Int. Cl.
| | | |
|---|---|---|
| H01L 21/00 | (2006.01) |
| H01L 29/66 | (2006.01) |
| H01L 29/06 | (2006.01) |
| H01L 21/306 | (2006.01) |
| H01L 29/08 | (2006.01) |

(Continued)

(52) U.S. Cl.
CPC .... H01L 29/0673 (2013.01); H01L 21/30604 (2013.01); H01L 21/76897 (2013.01); H01L 29/0847 (2013.01); H01L 29/165 (2013.01); H01L 29/42392 (2013.01); H01L 29/66545 (2013.01); H01L 29/66636 (2013.01); H01L 29/66742 (2013.01); H01L 29/66795 (2013.01); H01L 29/7848 (2013.01); H01L 29/7851 (2013.01); H01L 29/78651 (2013.01)

(58) Field of Classification Search
CPC ......... H01L 29/66545; H01L 29/66795; H01L 29/0673; H01L 29/42392; H01L 21/02532
See application file for complete search history.

(56) References Cited

U.S. PATENT DOCUMENTS 9,129,829 B2  9/2015  Kuhn et al.
9,741,792 B2 * 8/2017  Cheng ................. H01L 29/0673
(Continued)

OTHER PUBLICATIONS

IBM: List of IBM Patents or Patent Applications Treated As Related (Appendix P), Oct. 12, 2017, pp. 1-2.

(Continued)

*Primary Examiner* — Nicholas Tobergte
(74) *Attorney, Agent, or Firm* — Michael O'Keefe

(57) ABSTRACT

A method of forming a semiconductor device and resulting device. The method may form a first gate on a gate region of a starting substrate. The starting substrate includes alternating sacrificial layers and semiconductor layers above a buffer sacrificial layer located on a bulk substrate. The method may remove the starting substrate located between the gates. Etching the starting substrate creates a trench into the bulk substrate. The method may form an insulating layer on the inside of the trench. The method may form a masking layer over in the trench in the starting substrate covering a portion of the insulating layer, but below a top surface of the buffer layer. The method may remove the unmasked portion of the insulating layer. The method may form a source/drain in the trench. The method may remove the buffer sacrificial layer, and the sacrificial layers in the layered nanosheet.

15 Claims, 14 Drawing Sheets

(51) Int. Cl.
*H01L 21/768* (2006.01)
*H01L 29/423* (2006.01)
*H01L 29/786* (2006.01)
*H01L 29/78* (2006.01)
*H01L 29/165* (2006.01)

(56) References Cited

U.S. PATENT DOCUMENTS

| | | | |
|---|---|---|---|
| 2013/0341704 A1* | 12/2013 | Rachmady | H01L 29/66545 |
| | | | 257/327 |
| 2014/0264253 A1 | 9/2014 | Kim et al. | |
| 2015/0333167 A1 | 11/2015 | Leobandung | |
| 2016/0126310 A1 | 5/2016 | Rodder et al. | |
| 2016/0163796 A1 | 6/2016 | Obradovic et al. | |
| 2016/0233344 A1 | 8/2016 | Pillariselly et al. | |
| 2016/0252478 A1 | 9/2016 | Lee et al. | |
| 2017/0117359 A1* | 4/2017 | Cheng | H01L 29/0673 |

OTHER PUBLICATIONS

Cheng et al., U.S. Appl. No. 15/701,894, filed Sep. 12, 2017, titled "Nanosheet Transistors on Bulk Material", pp. 1-31.

* cited by examiner

NANOSHEET TRANSISTORS ON BULK MATERIAL

BACKGROUND

The present invention relates to semiconductor structures, and more specifically, to forming nanosheet transistors on bulk material.

Fin field effect transistors (FinFETs) are an emerging technology which may provide solutions to field effect transistor (FET) scaling problems at, and below, the 22 nm node. FinFET structures may include at least a narrow semiconductor fin gated on at least two sides of each of the semiconductor fin, as well as a source region and a drain region adjacent to the fin on opposite sides of the gate. FinFET structures having n-type source and drain regions may be referred to as nFinFETs, and FinFET structures having p-type source and drain regions may be referred to as pFinFETs.

The degree of control of electronic transport in the channel region of a field effect transistor is a predominant factor determining the level of leakage currents. A wrap-around gate, such as in a nanosheet field effect transistor, is a configuration that enhances control of the electronic transport in the channel region of a field effect transistor. However, integration schemes employ a semiconductor-on-insulator (SOI) substrate increase the cost of production because SOI substrates are more expensive than bulk substrates.

SUMMARY

An embodiment includes a method of forming a semiconductor device. The embodiment may include forming a first gate on a gate region of a starting substrate. The starting substrate includes a layered nanosheet above a buffer sacrificial layer. The buffer sacrificial layer is located on a bulk substrate. The layered nanosheet includes alternating sacrificial layers and semiconductor layers. The embodiment may include anisotropically etching the starting substrate located between the plurality of gates. Etching the starting substrate creates a trench through the layered nanosheet and the buffer sacrificial layer and into the bulk substrate. The embodiment may include forming an insulating layer on the inside of the trench. The embodiment may include forming a masking layer over in the trench in the starting substrate. A top surface of the masking layer is below a top surface of the buffer sacrificial layer and covering a portion of the insulating layer. The embodiment may include removing the unmasked portion of the insulating layer. The embodiment may include forming a source/drain in the trench. The embodiment may include removing the buffer sacrificial layer, and the sacrificial layers in the layered nanosheet.

An embodiment includes a semiconductor structure. The embodiment may include a first source/drain located in a first source/drain region. The embodiment may include a second source/drain located in a second source/drain region. The embodiment may include a plurality of semiconductor nanosheets located between the first source/drain and the second source/drain in a gate region. The embodiment may include an insulating layer separating the first source drain from a bulk substrate. The bulk substrate may have a first horizontal surface in the gate region, a second horizontal surface in the first source/drain region, and a connecting surface forming an at least partially vertical connection between the first horizontal surface and the second horizontal surface. The insulating layer may be directly on the second horizontal surface and the connecting surface.

Figure 1:
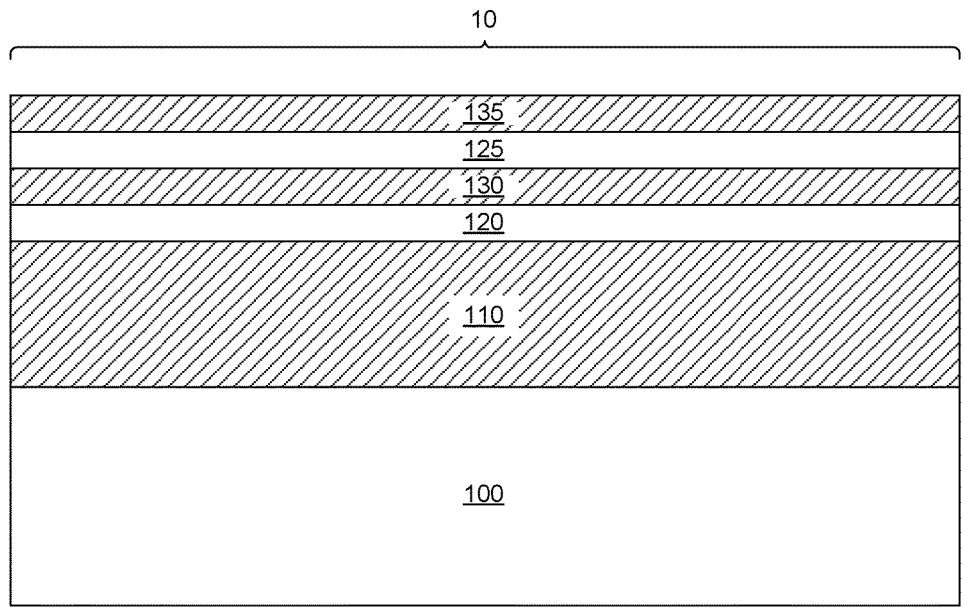
FIG. 1 depicts a cross sectional view of a starting substrate, where the starting substrate has alternating layers of sacrificial material and semiconductor material, according to an exemplary embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The terms substantially, substantially similar, or about refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances, may have not been described in detail. In other instances, some processing steps or operations that are known in the art may not be described at all. It should be understood that the following description is rather focused on the distinctive features or elements of various embodiments of the present invention.

As device sizes scale down, and voltages increase, nanosheet transistors become an increasingly effective geometry for field effect transistors, by reducing leakage across the transistor. Further, traditional designs using semiconductor on insulator substrates isolate each gate from a bulk material, which minimizes leakage from the transistor. However, when such structure is implemented on bulk material, leakage may occur from the structures, as there is no physical isolation between the bottom nanosheet and the bulk material. Included below are methods, and the resulting structures, for isolation of the nanosheet gates from the bulk material during fabrication of the nanosheet transistor.

Referring to FIG. 1, a semiconductor structure may be formed from a starting material 10 having a layered configuration such as a substrate 100, a buffer layer 110, a first semiconductor layer 120, a first sacrificial layer 130, a second semiconductor layer 125, and a second sacrificial layer 135. Further, additional embodiments are contemplated having additional semiconductor layers, and sacrificial layers.

In some embodiments, the substrate 100 may be a bulk substrate. The substrate 100 may be made of any semiconductor material typically known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Additionally, the first semiconductor layer 120 and the second semiconductor layer 125 may be formed with the same types of material as the substrate 100. In some embodiments, the first semiconductor layer 120 and the second semiconductor layer 125 may be the same material as the substrate 100.

Buffer layer 110, first sacrificial layer 130 and second sacrificial layer 135 may contain material selected that may be selectively removed without damaging substrate 100, first semiconductor layer 120, and second semiconductor layer 125. In an example embodiment, Buffer layer 110, first sacrificial layer 130, and second sacrificial layer 135 may be selected as silicon-germanium, while substrate 100, first semiconductor layer 120, and second semiconductor layer 125 contain silicon.

The starting material shown 10 in FIG. 1 may be achieved by epitaxially growing the materials on substrate 100, alternating between the sacrificial material and the semiconductor material. In an example embodiment, buffer layer 110 may be grown thicker than the rest of the other layers in order to ease subsequent processing steps. Buffer layer 110 may have a thickness ranging from 50 nm to approximately 200 nm, preferably approximately 100 nm to approximately 150 nm. First sacrificial layer 130 and second sacrificial layer 135 may have a thickness ranging from 4 nm to approximately 10 nm, preferably approximately 5 nm to approximately 7 nm. First semiconductor layer 120 and second semiconductor layer 125 may have a thickness ranging from 4 nm to approximately 10 nm, preferably approximately 5 nm to approximately 7 nm.

Figure 2:
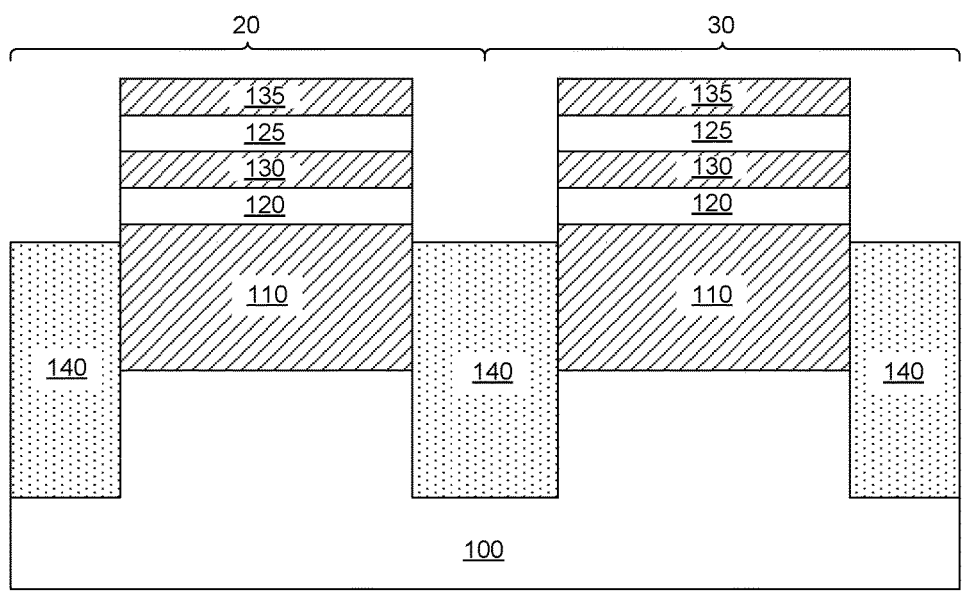
FIG. 2 depicts a cross sectional view of two regions of the starting substrate following shallow trench isolation, according to an exemplary embodiment.

Referring to FIG. 2, shallow trench isolation (STI) 140 may be performed creating multiple FET structures. A trench may be formed in the starting material 10 using lithographic patterning and etching of the material forming a first structure 20 and second structure 30. The trench may be created with a thickness and depth to reduce current leakage across the trench once it has been filled with a dielectric material. The trench may be formed using a photolithography process followed by an anisotropic etching process such as reactive ion etching (RIE) or plasma etching. STI 140 layer may be deposited in the trench. STI 140 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics and may be formed using any suitable deposition techniques including ALD, CVD, plasma enhanced CVD, spin on deposition, or PVD.

Figure 3:
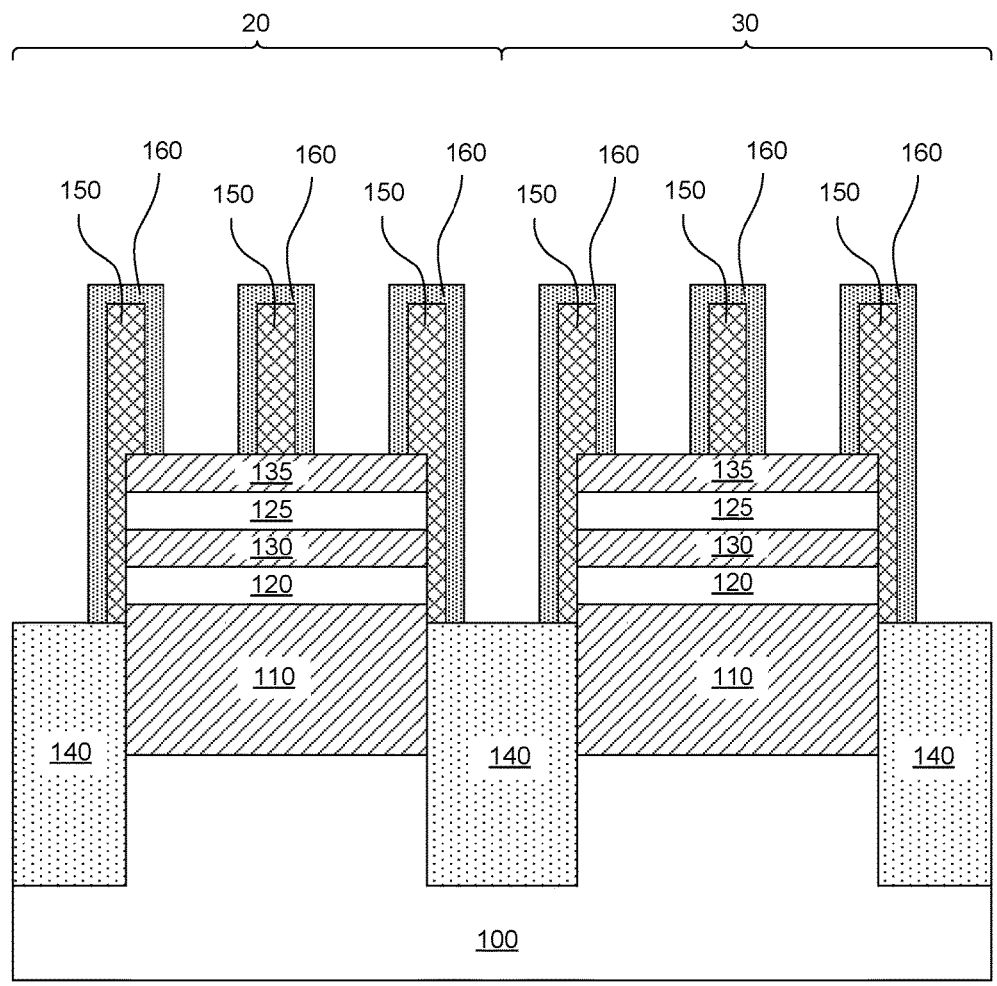
FIG. 3 depicts a cross sectional view of the two regions following dummy gate formation above the regions, according to an exemplary embodiment.

Referring to FIG. 3, dummy gates may be formed above the first structure 20 and the second structure 30. In forming the dummy gates, a dummy gate layer may be formed above the first structure 20 and the second structure 30 shown in FIG. 2. In such embodiments, the dummy gate layer may be made of any suitable sacrificial material, for example, amorphous or polycrystalline silicon. The dummy gate layer may have any thickness ranging from approximately 30 nm to approximately 200 nm. The dummy gate layer may be deposited by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD).

Following deposition of the dummy gate layer a dummy gate structure, containing dummy gate 150 and spacer 160, may be formed. Formation of the dummy gate structure may be accomplished by lithographic patterning of the desired gate regions, and subsequently etching away the dummy gate layer from the unpatterned areas. Suitable lithographic materials include, for example, a photoresist layer. Etching may be accomplished by any suitable technique, such as, for example, reactive ion etching (RIE) or wet stripping.

After formation of the dummy gate 150, spacer 160 may be formed surrounding the dummy gate 150. The spacer 160 may be made of any insulating material, such as silicon nitride, silicon oxide, silicon oxynitrides, or a combination thereof, and may have a thickness ranging from 2 nm to approximately 100 nm, preferably approximately 2 nm to approximately 25 nm. The spacers may be made of an insulating material, such as, for example, silicon nitride, silicon oxide, silicon oxynitrides, or a combination thereof. The spacer 160 may be formed by any method known in the art, including depositing a conformal silicon nitride layer over the dummy gate 150 and removing unwanted material from the conformal silicon nitride layer using an anisotropic etching process such as, for example, reactive ion etching (ME) or plasma etching (not shown). Methods of forming spacers are well-known in the art and other methods are explicitly contemplated. Further, in various embodiments, the spacer 160 may include one or more layers.

Figure 4:
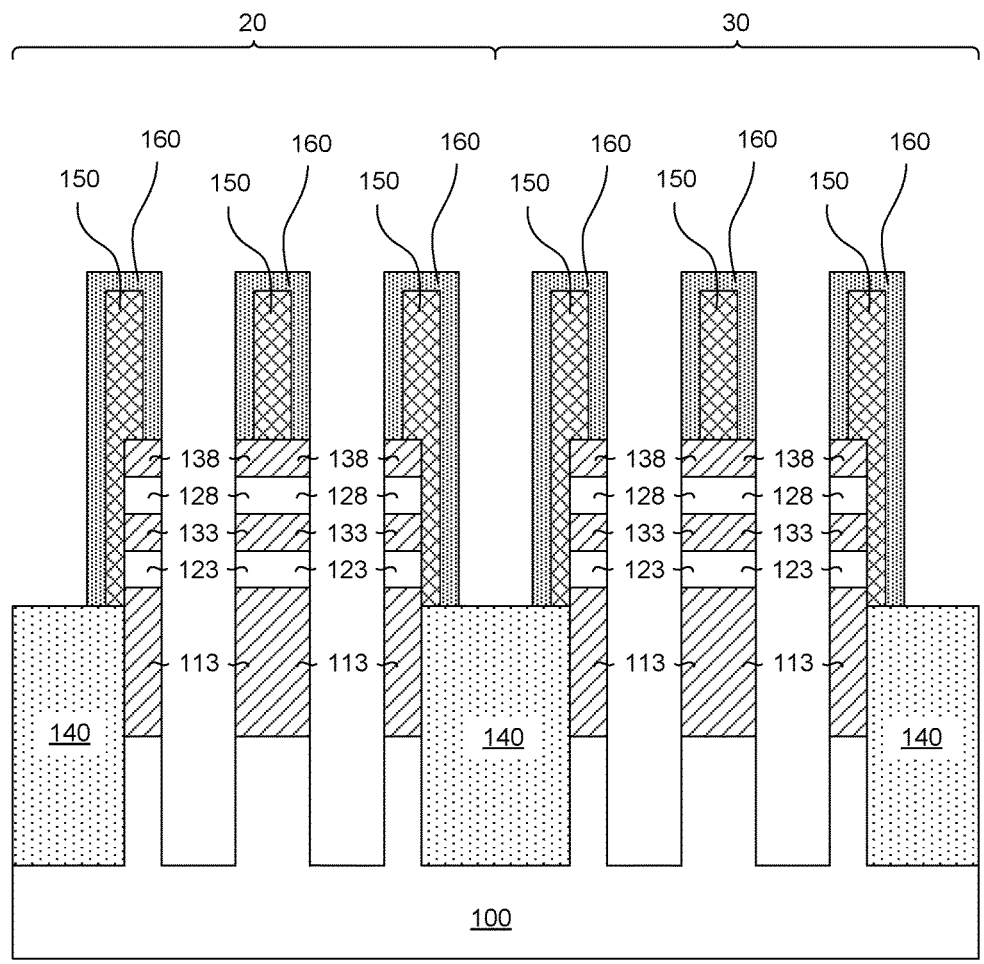
FIG. 4 depicts a cross sectional view of two regions following an anisotropic etch of the exposed source/drain region each region, according to an exemplary embodiment.

Referring to FIG. 4, an anisotropic etch may be performed to remove material between each dummy gate structure. Following the anisotropic etch, gate buffer layer 113, first gate sacrificial layer 133, second gate sacrificial layer 138, first gate semiconductor layer 123 and second gate semiconductor layer 128 only remain beneath the dummy gate structure. The anisotropic etch may be accomplished by any suitable technique, such as, for example, reactive ion etching (ME).

Figure 5:
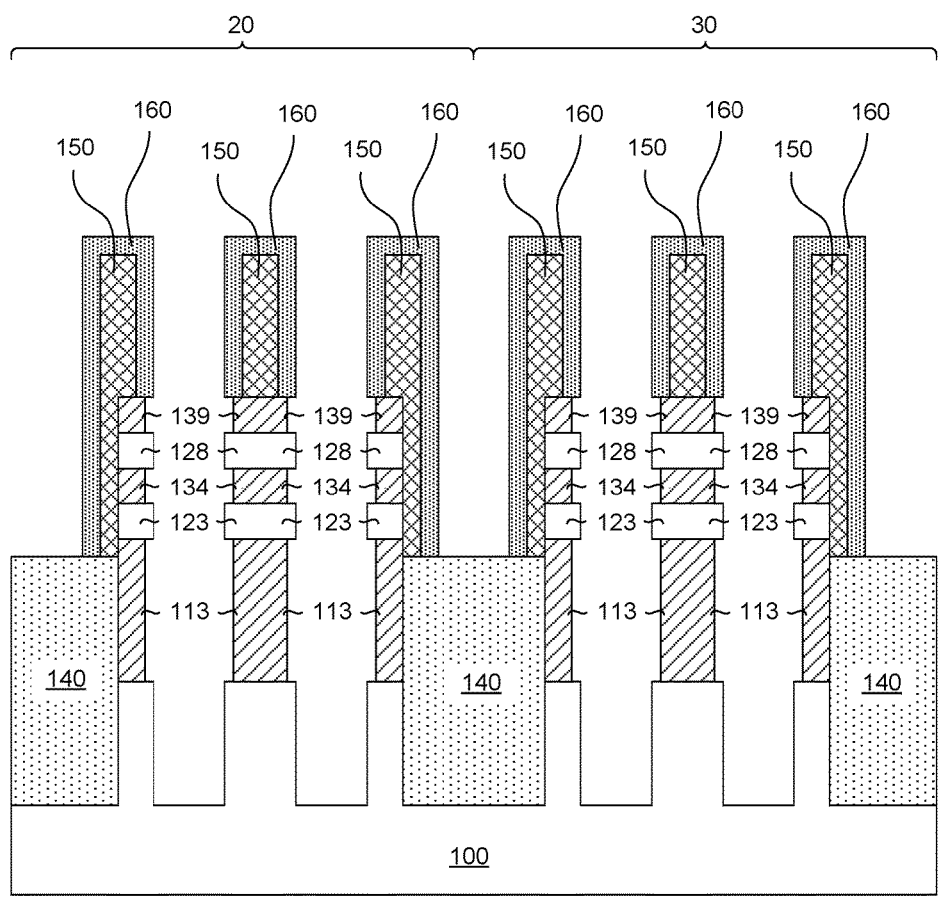
FIG. 5 depicts a cross sectional view of the two regions following a pullback of the sacrificial layers, according to an exemplary embodiment.

Referring to FIG. 5, an isotropic etch may be performed to pull back, or selectively remove, the material of the gate buffer layer 113, first gate sacrificial layer 133, and second gate sacrificial layer 138, while maintaining first gate semiconductor layer 123 and second gate semiconductor layer 128, forming a pulled back gate buffer layer 114, a pulled back first gate sacrificial layer 134, and a pulled back second gate sacrificial layer 139. The pull back staggers the vertical interface created during the anisotropic etch such that the vertical interface of the pulled back gate buffer layer 114, the pulled back first gate sacrificial layer 134, and the pulled back second gate sacrificial layer 139 is not the same as the vertical interface of first gate semiconductor layer 123 and second gate semiconductor layer 128. The isotropic etch may be accomplished by any suitable technique capable of selectively removing the gate buffer layer 113, first gate sacrificial layer 133, second gate sacrificial layer 138, such as, for example, wet and dry etching techniques.

Figure 6:
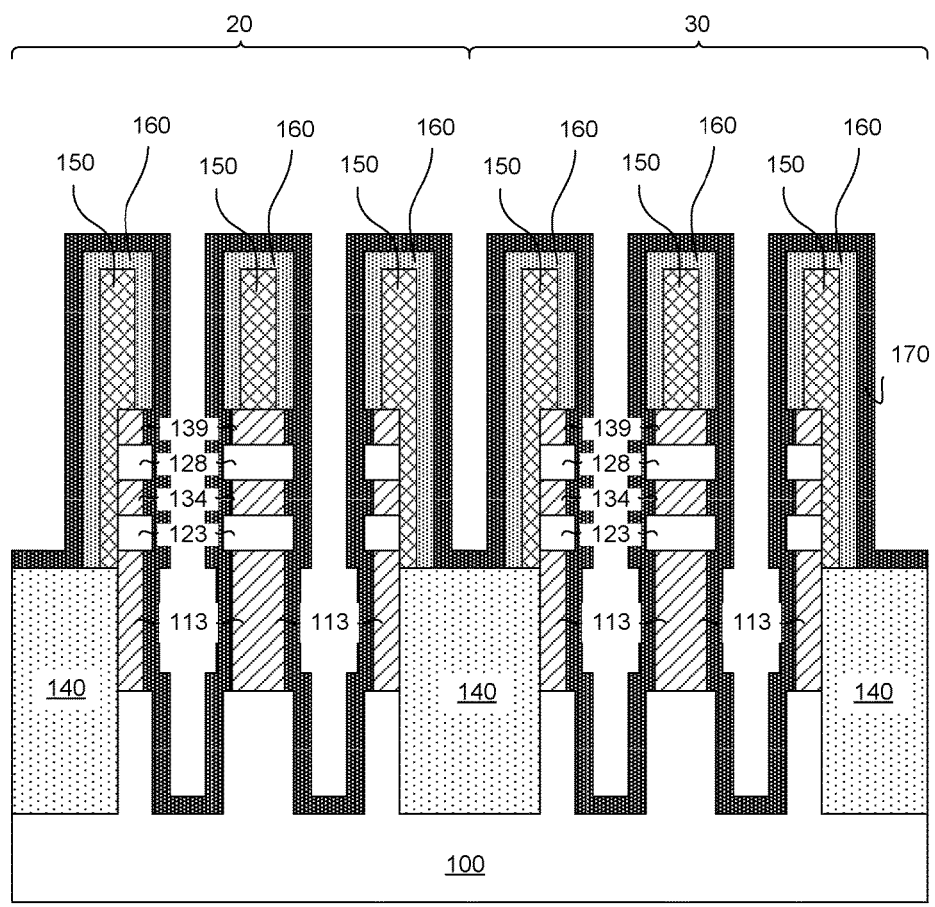
FIG. 6 depicts a cross sectional view of the two regions following isolation layer deposition, according to an exemplary embodiment.

Referring to FIG. 6, conformal deposition of an insulating layer 170 may be performed. The insulating layer 170 may be formed by conformal deposition of an insulating material on the exposed surfaces of the structure depicted in FIG. 5. Further, in various embodiments, the insulating layer 170 may include one or more layers. The insulating layer 170 may be any suitable oxide, nitride or oxynitride material, such as silicon nitride.

Figure 7:
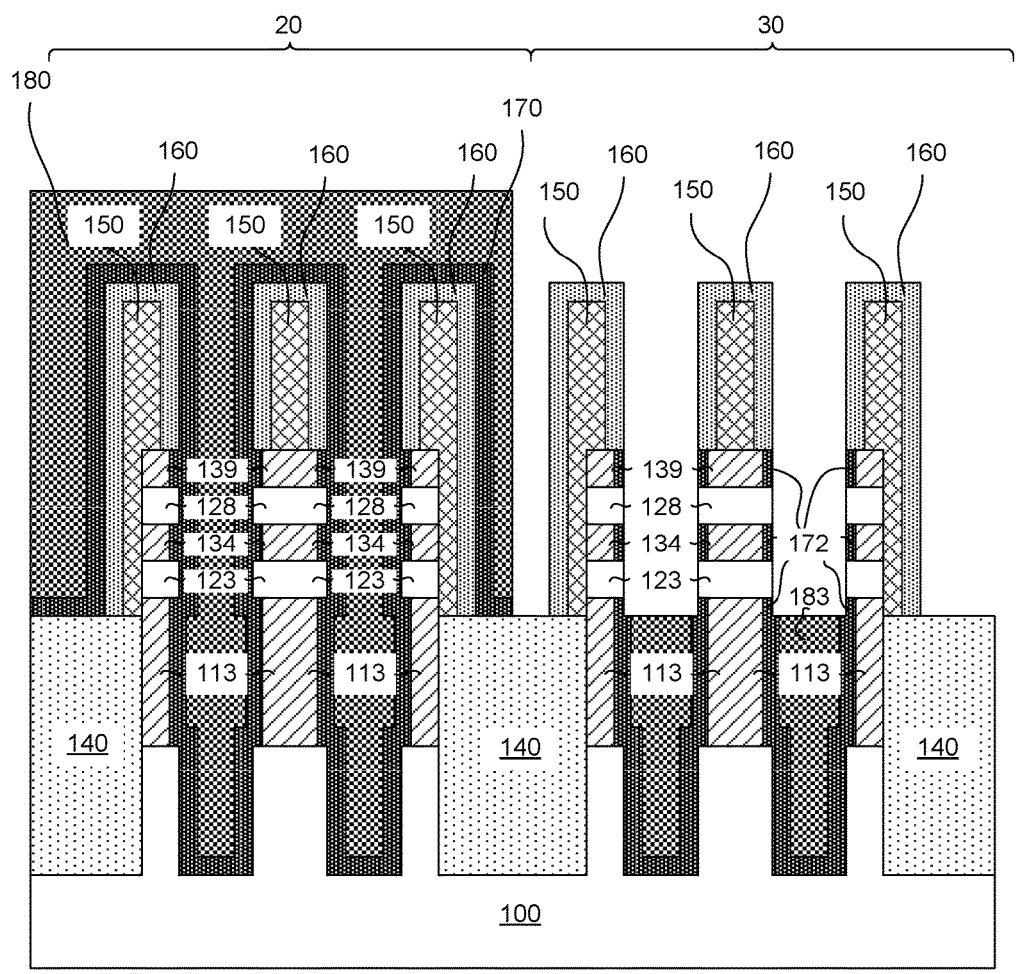
FIG. 7 depicts a cross sectional view of the two regions following masking of the first region, masking of a bottom portion of the second region, and removal of the unmasked isolation layer, according to an exemplary embodiment.

Referring to FIG. 7, a masking of the first region and partial mask of the second region may be performed, and the insulating layer 170 may be partially removed. A masking layer 180 may be deposited on the first region and second region to allow selective removal of a portion of the masking layer the second region, while preserving entire masking layer 180 in first region. The masking layer 180 may include, for example, an organic planarization layer (OPL), an oxide hardmask and combinations thereof. The masking layer 180 may be formed by any suitable deposition technique or techniques known in the art, including, for example, ALD, CVD, PVD, MBD, PLD, and LSMCD. The OPL may be included to form a level surface for deposition of additional layers. Accordingly, the OPL may have any thickness suitable to cover the nitrogen impermeable layer and have a substantially flat top surface. The oxide hard mask may be made of any suitable oxide masking material, such as silicon oxide.

The masking layer 180 may be etched to remove a portion of the masking layer in the second region, thereby exposing insulating layer 170 and retaining a portion of the second region masking layer 183. Prior to etching, a photoresist layer is patterned, using known lithographic patterning techniques, to the desired structure. Etching the masking layer 180 may be accomplished through any combination of known techniques, such as, for example, RIE, wet stripping and plasma etching. In performing the etching, a timed etch may be performed in which a portion of the second region masking layer 183 is retained between the dummy gates, and below the first gate semiconductor layer 123 in the second region.

The insulating layer 170 may be partially removed in the second region using the masking layer 180 as a mask to protect the first region, and the second region masking layer 183 to protect a portion of the insulating layer 170 located in the trench. Removal of the insulating layer may be accomplished through any combination of known techniques, such as, for example, RIE, wet stripping and plasma etching. Due to the anisotropic nature of the etch, and continued masking from the portion of the second region masking layer 183, insulating remnants 172 may only cover the vertical surfaces of pulled back first gate sacrificial layer 134, and pulled back second gate sacrificial layer 139, thereby preventing epitaxial growth on the structures in subsequent steps. Additionally, insulating remnants 172 are retained along the exposed surface of substrate 100 in a source/drain region of the device, which may act as an electrical barrier between first gate semiconductor layer 123 and the bulk substrate, thereby reducing leakage to the substrate.

Figure 8:
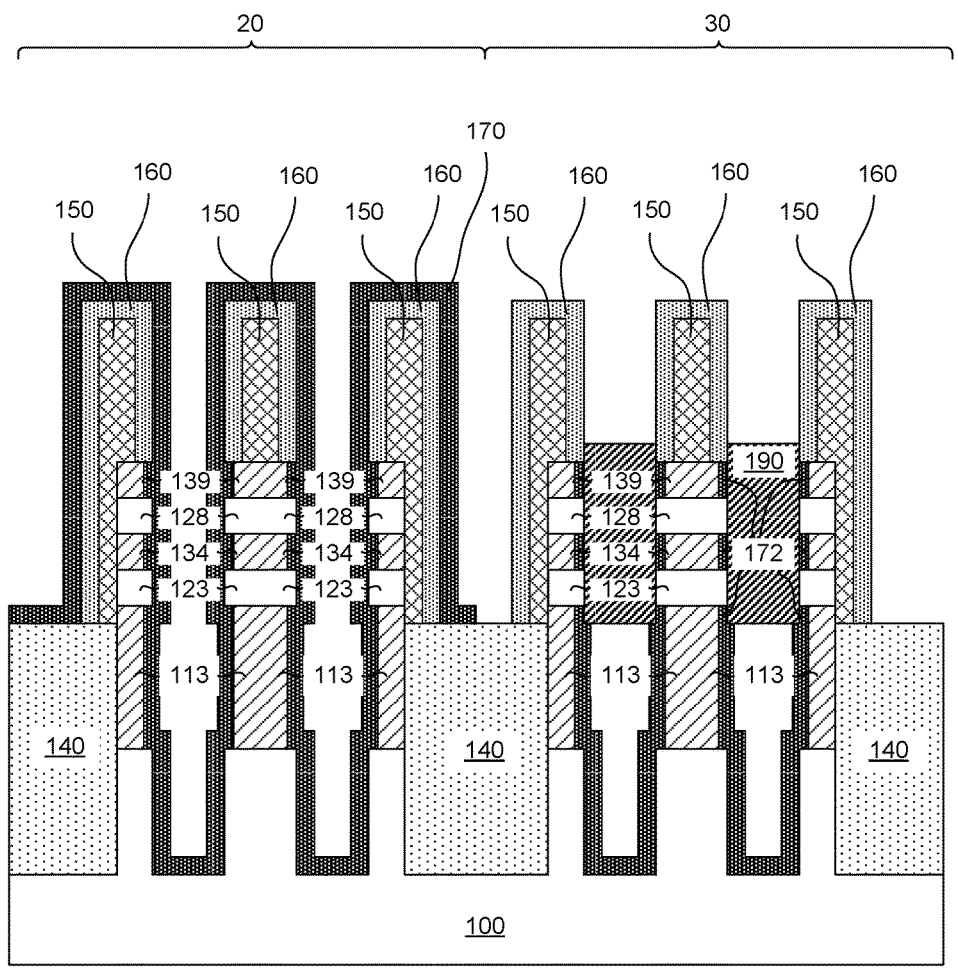
FIG. 8 depicts a cross sectional view of the two regions following epitaxial growth of the source/drains in the second region and removal of the masks, according to an exemplary embodiment.

Referring to FIG. 8, second region source/drain 190 may be formed between first gate semiconductor layer 123 and second gate semiconductor layer 128 using epitaxial growth. In some embodiments, second region source/drain 190 may be silicon-germanium. In such an embodiment, the semiconductor material may contain, for example, approximately 20% to approximately 100% germanium, approximately 0% to approximately 80% silicon, and may be doped with p-type dopants such as boron in concentrations ranging from approximately $1\times10^{20}$ atoms/cm$^3$ to approximately $2\times10^{21}$ atoms/cm$^3$. In another example embodiment, the semiconductor material may be carbon doped silicon. In such an embodiment, the semiconductor material may contain, for example, approximately 0.5% to approximately 2.5% carbon, approximately 97.5% to approximately 99.5% silicon, and may be doped with n-type dopants such as arsenic or phosphorus in concentrations ranging from approximately $1\times10^{20}$ atoms/cm$^3$ to approximately $2\times10^{21}$ atoms/cm$^3$. Removal of the masking layer 180 and the portion of the second region masking layer 183 may occur following, epitaxial growth.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Figure 9:
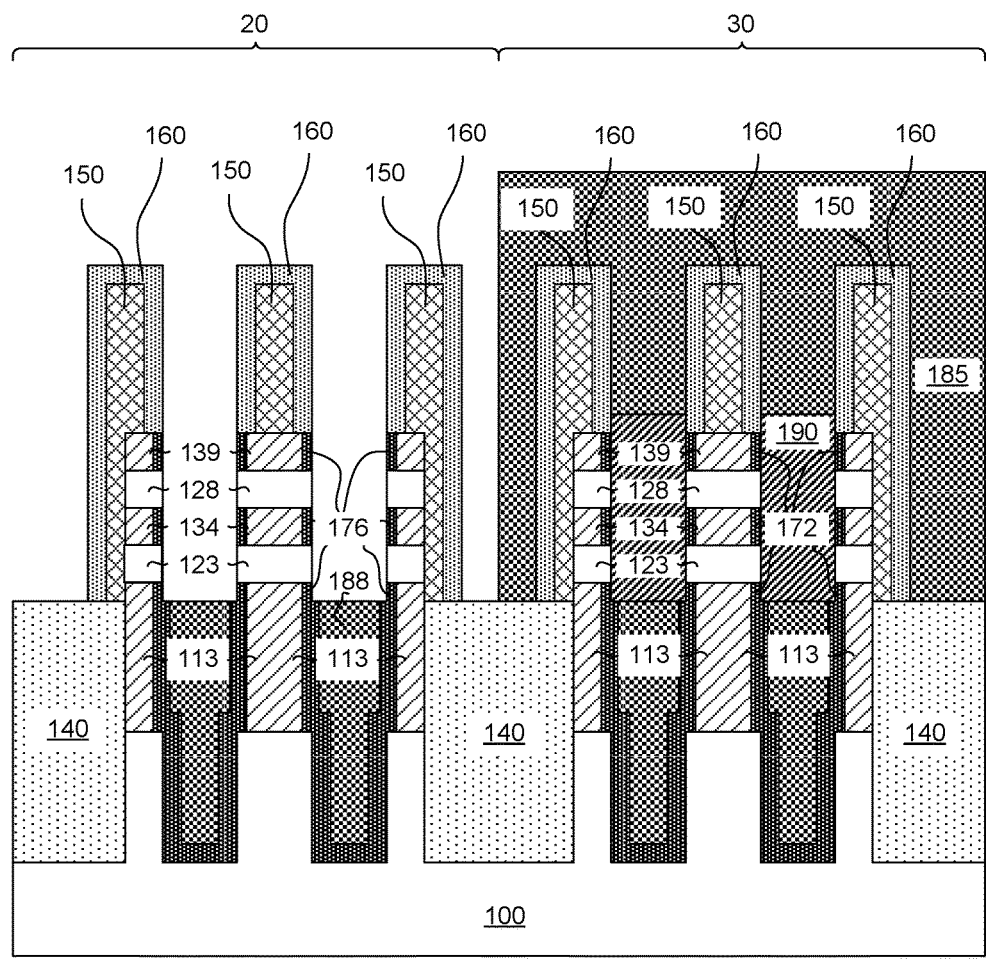
FIG. 9 depicts a cross sectional view the two regions following masking of the second region, masking of a bottom portion of the first region, and removal of the unmasked isolation layer, according to an exemplary embodiment.

Referring to FIG. 9, a masking of the second region and partial mask of the first region may be performed, and the insulating layer 170 may be partially removed. A masking layer 185 may be deposited on the first region and second region to allow selective removal of a portion of the masking layer the first region, while preserving entire masking layer 185 in second region. The masking layer 185 may include, for example, an organic planarization layer (OPL), an oxide hardmask and combinations thereof. The masking layer 185 may be formed by any suitable deposition technique or techniques known in the art, including, for example, ALD, CVD, PVD, MBD, PLD, and LSMCD. The OPL may be included to form a level surface for deposition of additional layers. Accordingly, the OPL may have any thickness suitable to cover the nitrogen impermeable layer and have a substantially flat top surface. The oxide hard mask may be made of any suitable oxide masking material, such as silicon oxide.

The masking layer 185 may be etched to remove a portion of the masking layer in the first region, thereby exposing insulating layer 170 and retaining a portion of the first region masking layer 188. Prior to etching, a photoresist layer is patterned, using known lithographic patterning techniques, to the desired structure. Etching the masking layer 185 may be accomplished through any combination of known techniques, such as, for example, RIE, wet stripping and plasma etching. In performing the etching, a timed etch may be performed in which a portion of the first region masking layer 188 is retained between the dummy gates, and below the first gate semiconductor layer 123 in the first region.

The insulating layer 170 may be partially removed in the first region using the masking layer 185 as a mask to protect the second region and the first region masking layer 188 to protect a portion of the insulating layer 170 located in the trench. Removal of the insulating layer may be accomplished through any combination of known techniques, such as, for example, RIE, wet stripping and plasma etching. Due to the anistotropic nature of the etch, and continued masking from the portion of the first region masking layer 188, insulating remnants 176 may only cover the vertical surfaces of pulled back first gate sacrificial layer 134, and pulled back second gate sacrificial layer 139, thereby preventing epitaxial growth on the structures in subsequent steps. Additionally, insulating remnants 176 are retained along the exposed surface of substrate 100 in a source/drain region of the device, which may act as an electrical barrier between first gate semiconductor layer 123 and the bulk substrate, thereby reducing leakage to the substrate.

Figure 10:
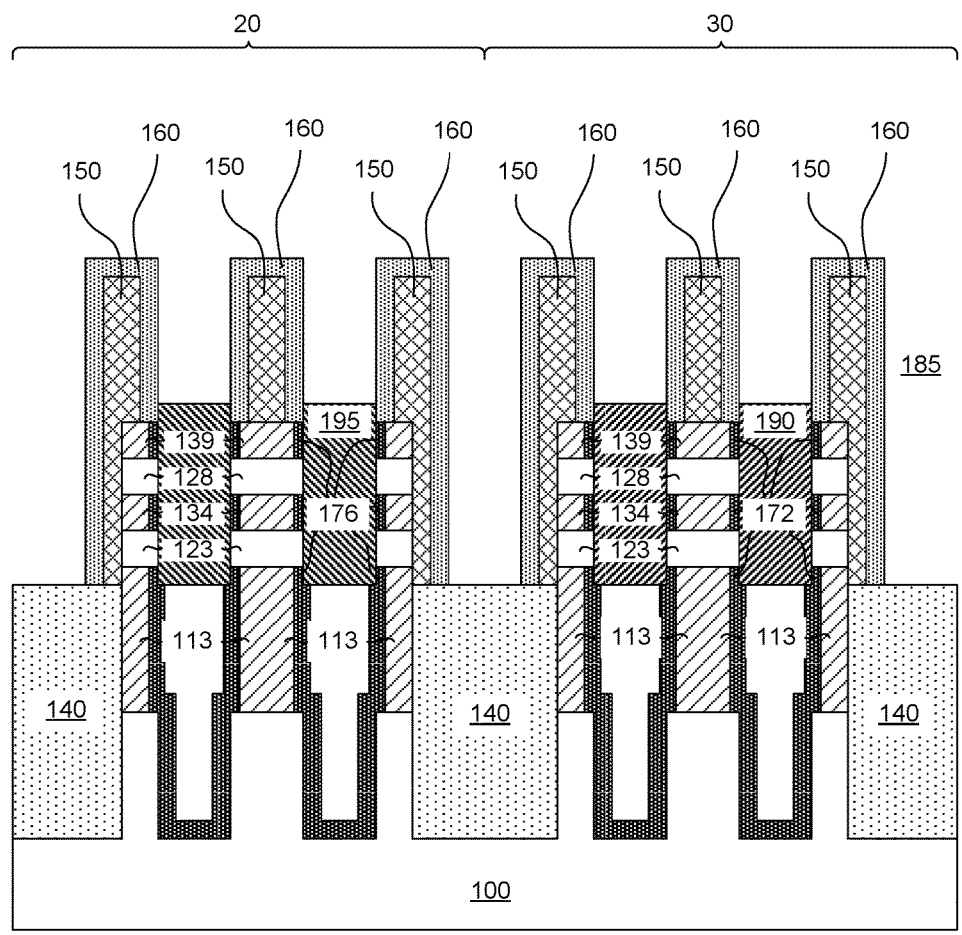
FIG. 10 depicts a cross sectional view of the two regions following epitaxial growth of the source/drains in the first region and removal of the masks, according to an exemplary embodiment.

Referring to FIG. 10, first region source/drain 195 may be formed between first gate semiconductor layer 123 and second gate semiconductor layer 128 using epitaxial growth. In some embodiments, first region source/drain 195 may be silicon-germanium. In such an embodiment, the semiconductor material may contain, for example, approximately 20% to approximately 100% germanium, approximately 0% to approximately 80% silicon, and may be doped with p-type dopants such as boron in concentrations ranging from approximately $1 \times 10^{20}$ atoms/cm$^3$ to approximately $2 \times 10^{21}$ atoms/cm$^3$. In another example embodiment, the semiconductor material may be carbon doped silicon. In such an embodiment, the semiconductor material may contain, for example, approximately 0.5% to approximately 2.5% carbon, approximately 97.5% to approximately 99.5% silicon, and may be doped with n-type dopants such as arsenic or phosphorus in concentrations ranging from approximately $1 \times 10^{20}$ atoms/cm$^3$ to approximately $2 \times 10^{21}$ atoms/cm$^3$. Removal of the masking layer 185 and the portion of the first region masking layer 188 may occur following, epitaxial growth.

Figure 11:
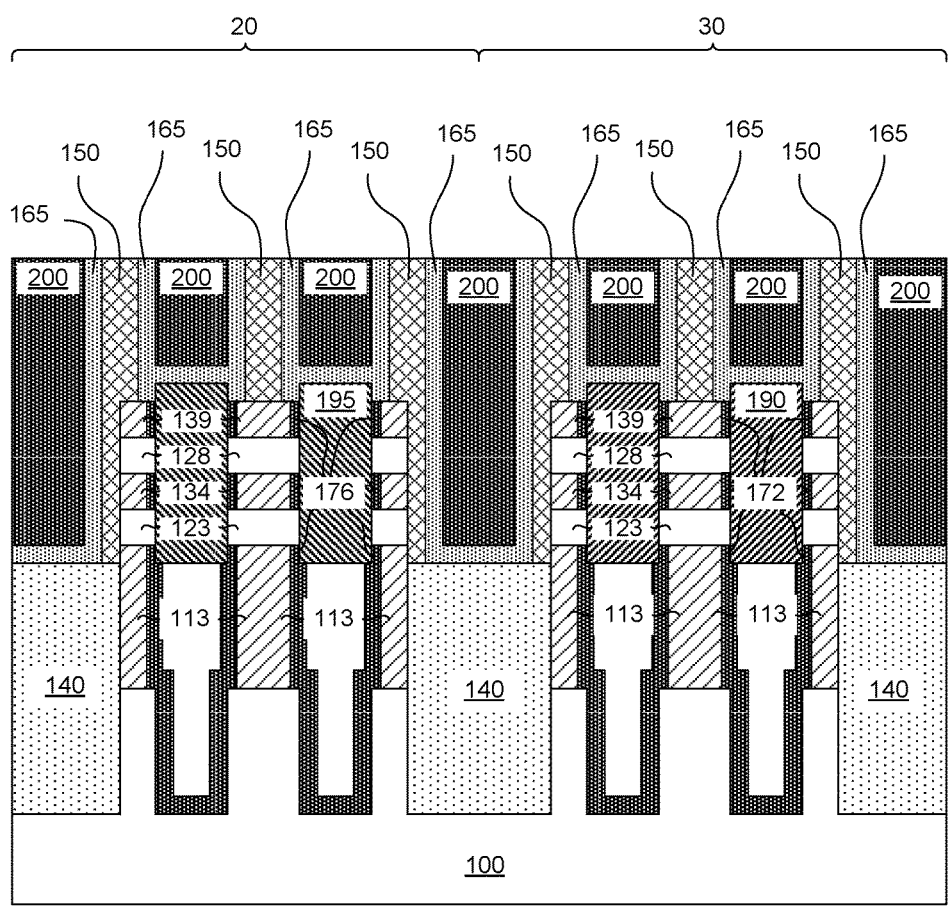
FIG. 11 depicts a cross sectional view of the two regions following ILD deposition and opening of the dummy gates, according to an exemplary embodiment.

Referring to FIG. 11, a conformal layer and inter layer dielectric (ILD) 200 may be deposited, and CMP may be performed in order to open up the dummy gate structure exposing dummy gate 150 resulting in the formation of spacer 165. conformal layer may be formed surrounding the dummy gate 150. The conformal layer may be made of any insulating material, such as silicon nitride, silicon oxide, silicon oxynitrides, or a combination thereof, and may have a thickness ranging from 2 nm to approximately 100 nm, preferably approximately 2 nm to approximately 25 nm. The spacers may be made of an insulating material, such as, for example, silicon nitride, silicon oxide, silicon oxynitrides, or a combination thereof. The conformal layer may be formed by any method known in the art, including depositing a conformal silicon nitride layer over the dummy gate 150 and removing unwanted material from the conformal silicon nitride layer using an anisotropic etching process such as, for example, reactive ion etching (RIE) or plasma etching (not shown). Methods of forming spacers are well-known in the art and other methods are explicitly contemplated. Further, in various embodiments, the conformal layer may include one or more layers.

The ILD 200 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics and may be formed using any suitable deposition techniques including ALD, CVD, plasma enhanced CVD, spin on deposition, or PVD. Following deposition, chemical mechanical planarization may occur, removing all of the material located above dummy gate 150. Additionally, while void 205, surrounded by the source/drain 195 on top, and insulating layer 176 on the sides and below, is depicted as being empty, alternative embodiments may include void 205 being partially filled or totally filled with material from ILD 200.

Figure 12:
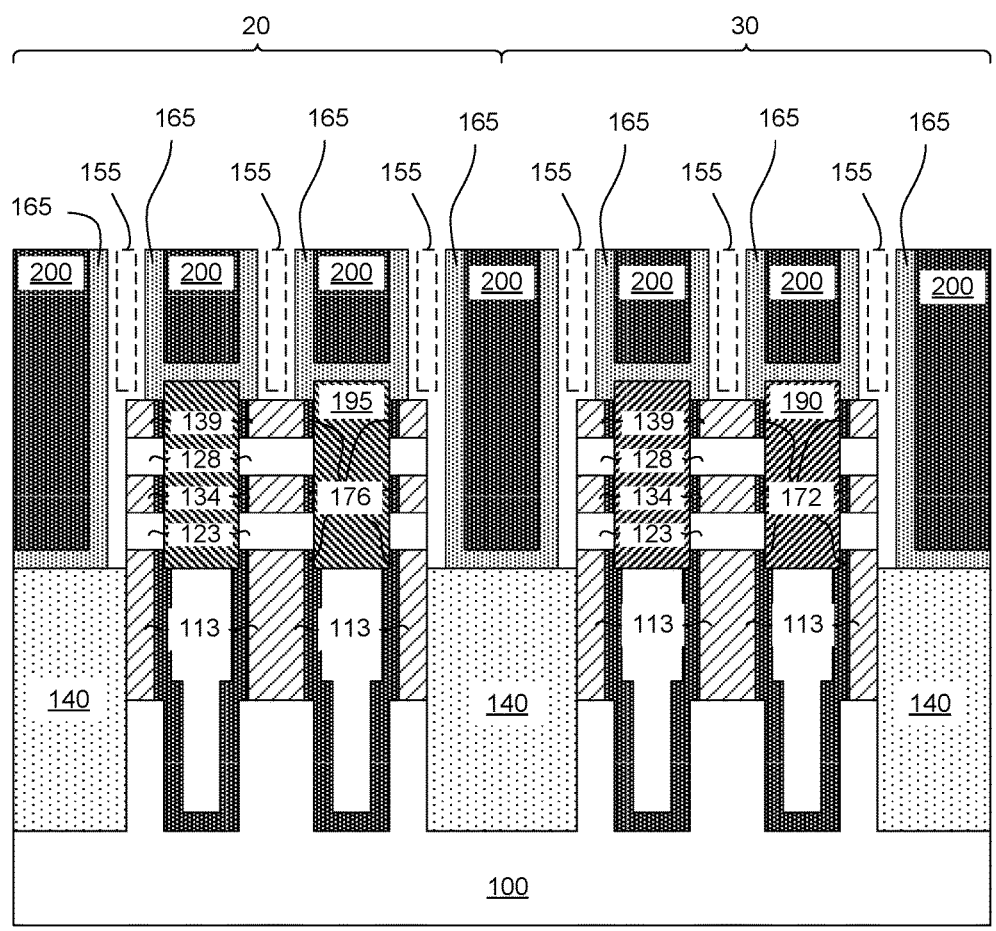
FIG. 12 depicts a cross sectional view of the two regions following removal of the dummy gate material, according to an exemplary embodiment.

Referring to FIG. 12, dummy gate 150 may be removed forming gate void 155. Dummy gate 150 may be removed by any suitable etching process known in the art capable of selectively removing the dummy gate 150 without substantially removing material from the surrounding structures. In an exemplary embodiment, the dummy gate 150 may be removed, for example, by a reactive ion etching (ME) process capable of selectively removing silicon.

Figure 13:
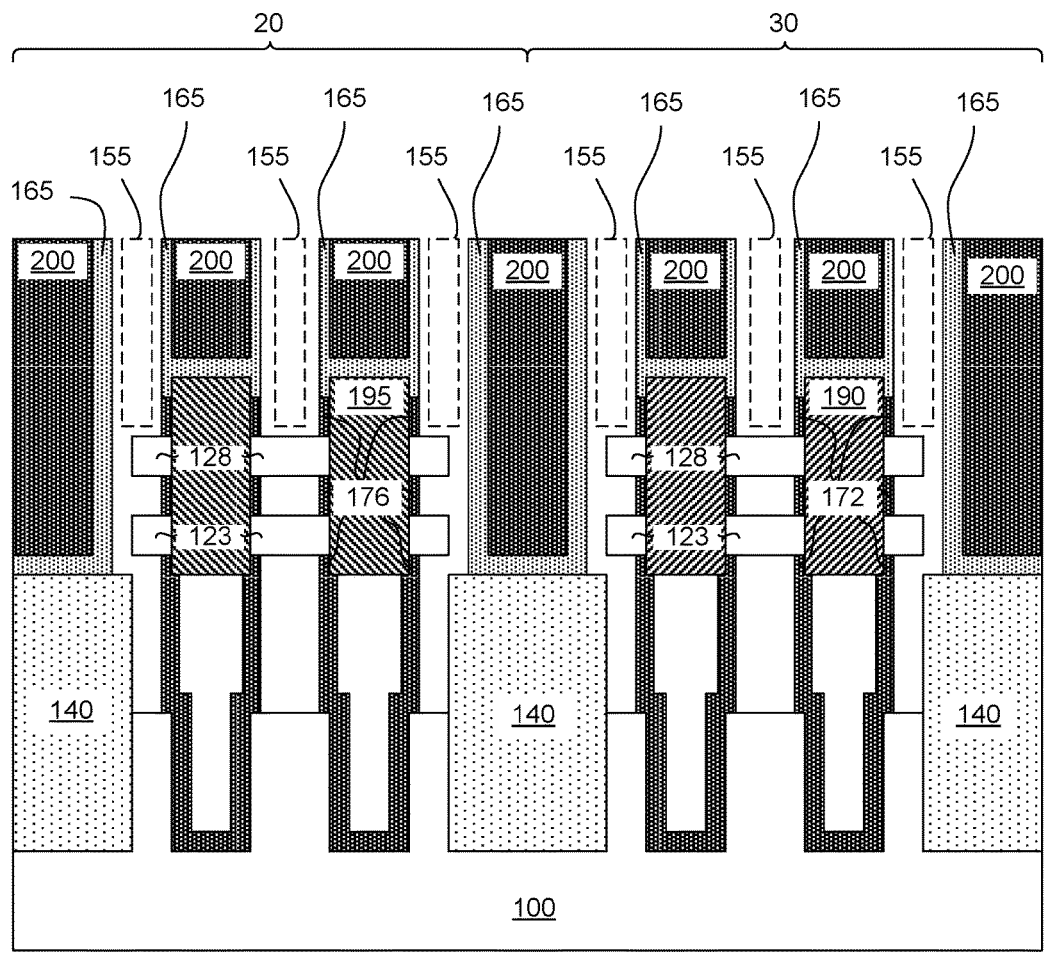
FIG. 13 depicts a cross sectional view of the two regions following removal of the sacrificial material, according to an exemplary embodiment.

Referring to FIG. 13, selective removal of the gate buffer layer 113, the pulled back first gate sacrificial layer 134, and the pulled back second gate sacrificial layer 139 may occur. Any suitable etching process known in the art capable of selectively removing the material in the gate buffer layer 113, the pulled back first gate sacrificial layer 134, and the pulled back second gate sacrificial layer 139, while retaining the material in first gate semiconductor layer 123 and second gate semiconductor layer 128 may be used, and selection of the etching process may be dependent on the specific materials considered.

Figure 14:
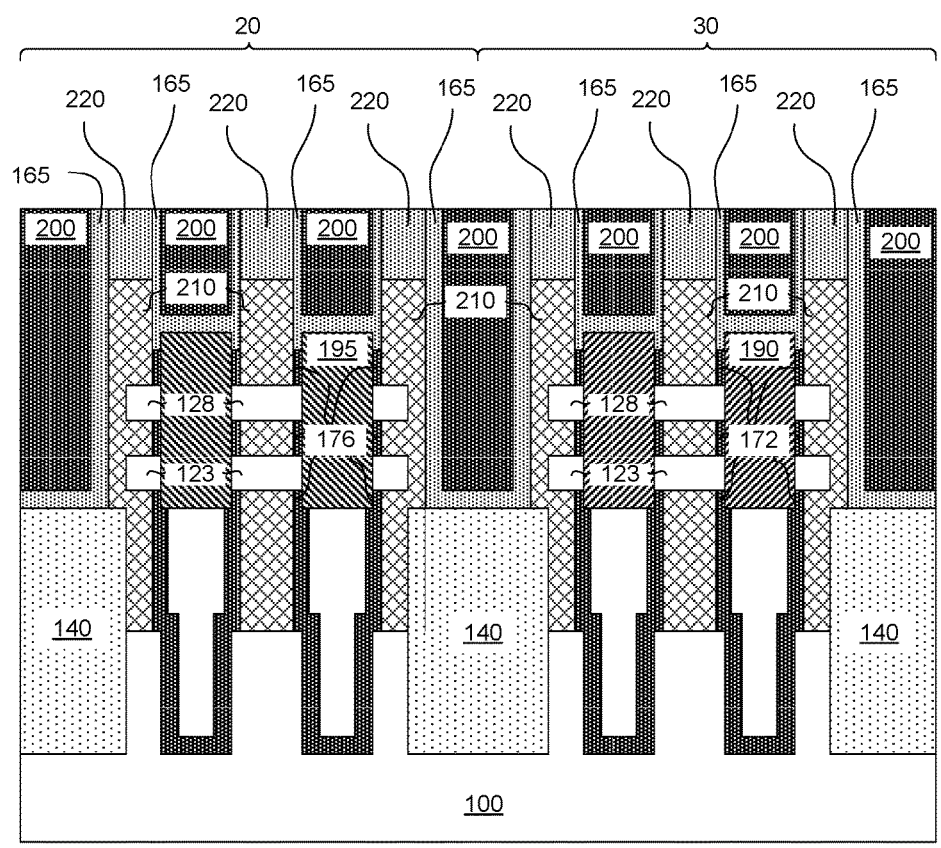
FIG. 14 depicts a cross sectional view of the two regions following gate formation, according to an exemplary embodiment.

Referring to FIG. 14, a replacement metal gate 210 may be formed in gate void 155. In one embodiment, the dielectric layer may include silicon oxide ($Si_xO_y$) or a high-k oxide such as, for example, hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The dielectric layer may be deposited using any suitable deposition technique known the art, including, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD).

Following the deposition of the dielectric layer, in some embodiments a work function metal layer may be deposited. The work function metal layer may include, for example, aluminum, lanthanum oxide, magnesium oxide, strontium titanate, strontium oxide, TiN, TaN. The work function metal layer may be formed using any suitable metal deposition technique, including, for example, CVD, PVD, and ALD, sputtering, and plating. In some embodiments, a high temperature anneal may be performed prior to the deposition of the gate electrode.

A gate electrode may be deposited above the dielectric layer or work function layer. The gate electrode may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The gate electrode may be formed using any suitable metal deposition technique, including, for example, CVD, PVD, and ALD, sputtering, and plating. Additionally, a gate cap 220 may fill the rest of the gate opening. The gate cap 220 may be formed using any suitable deposition techniques including ALD, CVD, plasma enhanced CVD, spin on deposition, or PVD. The gate cap 220 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics.

Figure 15:
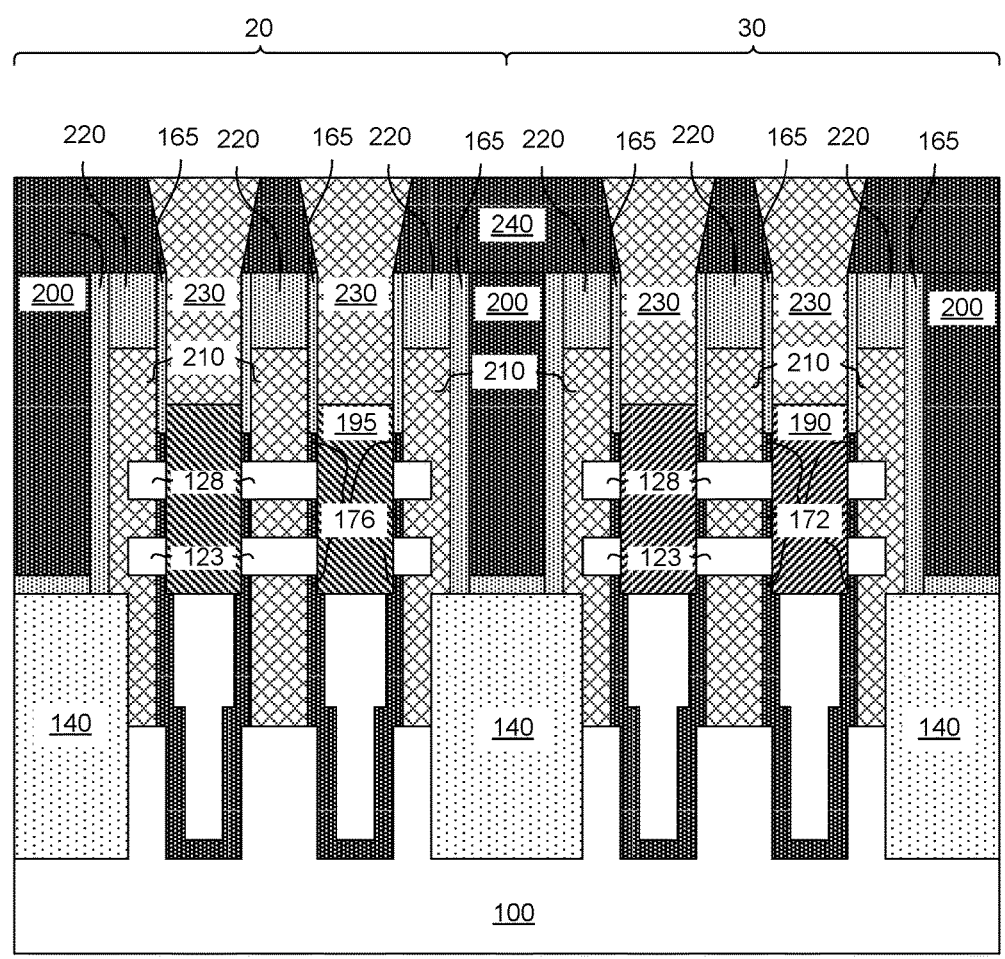
FIG. 15 depicts a cross sectional view of the two regions following contact formation, according to an exemplary embodiment.

Referring to FIG. 15, contact formation may occur. Initially, ILD 240 may be deposited over the structure, and subsequent damascene or dual damascene structures may be created. The ILD 240 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics and may be formed using any suitable deposition techniques including ALD, CVD, plasma enhanced CVD, spin on deposition, or PVD. Following deposition, chemical mechanical planarization may occur, removing all of the material located above dummy gate 150.

An opening may be formed in the ILD 240. The damascene opening may include a trench opening and two via openings. The opening may be formed using any suitable masking and etching technique known in the art. In one embodiment, a dry etching technique using a fluorine based etchant, such as, for example $C_xF_y$, may be used. In one embodiment, the depth of the trench opening may range from about 50 nm to about 100 nm. Also, the via openings may extend vertically from the bottom of the trench opening down to the top of.

A set of conductive contacts 230, may be formed within the opening. The set of conductive contacts 230 may contain a liner and a metal fill may be deposited in via recess. The liner may be made of, for example, tantalum or tantalum nitride, and may include one or more layers of liner material. The metal fill may include, for example, copper, aluminum, or tungsten. The liner and metal fill may be formed using a filing technique such as electroplating, electroless plating, chemical vapor deposition, physical vapor deposition or a combination of methods.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor device, the method comprising:
   forming a first gate on a gate region of a starting substrate, wherein the starting substrate comprises a layered nanosheet above a buffer sacrificial layer, wherein the buffer sacrificial layer is located on a bulk substrate, and wherein the layered nanosheet comprises alternating sacrificial layers and semiconductor layers;
   anisotropically etching the starting substrate in a source/drain region of the starting substrate, wherein etching the starting substrate creates a trench through the layered nanosheet and the buffer sacrificial layer and into the bulk substrate;
   forming an insulating layer on the inside of the trench;
   forming a masking layer over in the trench in the starting substrate, wherein a top surface of the masking layer is below a top surface of the buffer sacrificial layer and covering a portion of the insulating layer;
   removing the unmasked portion of the insulating layer;
   forming a source/drain in the trench; and
   removing the buffer sacrificial layer and the sacrificial layers in the layered nanosheet.

2. The method of claim 1 further comprising removing a portion of the buffer sacrificial layer and a portion of the sacrificial layers in the gate region.

3. The method of claim 2, wherein forming the insulating layer on the inside of the trench comprises depositing the insulating layer on a vertical surface of the buffer sacrificial layer and a vertical surface of the sacrificial layers, and wherein the vertical surface of the buffer sacrificial layer and the vertical surface of the sacrificial layers are located in the gate region.

4. The method of claim 3, wherein removing the unmasked portion of the insulating layer comprises an anisotropic etch.

5. The method of claim 3, wherein removing the unmasked portion of the insulating layer comprises retaining the portion of the insulating layer located beneath the first gate.

6. The method of claim 1, wherein the first gate is a dummy gate.

7. The method of claim 6 further comprising:
removing the dummy gate;
removing the buffer sacrificial layer and the sacrificial layers in the gate region;
forming a gate dielectric in the gate region; and
forming a gate metal in the gate region.

8. The method of claim 1, wherein a thickness of the buffer sacrificial layer is about 50 nm and about 200 nm.

9. The method of claim 1, wherein a thickness of each of the sacrificial layers is about 4 nm and about 10 nm.

10. The method of claim 1, wherein a thickness of each of the semiconductor layers is about 4 nm and about 10 nm.

11. The method of claim 1 further comprising:
forming an inter layer dielectric (ILD) above the source/drain and above the first gate, wherein forming the ILD completely fills a region between the source/drain and the insulating layer; and
forming source/drain contacts and a gate contact through the ILD.

12. The method of claim 1 further comprising:
forming an inter layer dielectric (ILD) above the source/drain and above the first gate, wherein forming the ILD partially fills a region between the source/drain and the insulating layer; and
forming source/drain contacts and a gate contact through the ILD.

13. The method of claim 1 further comprising:
forming an inter layer dielectric (ILD) above the source/drain and above the first gate, wherein forming the ILD completely fills a region between the source/drain and the insulating layer; and
forming source/drain contacts and a gate contact through the ILD.

14. The method of claim 1 further comprising:
forming an inter layer dielectric (ILD) above the source/drain and above the first gate, wherein there is no ILD in a region between the source/drain and the insulating layer; and
forming source/drain contacts and a gate contact through the ILD.

15. The method of claim 1, wherein the sacrificial layers and the sacrificial buffer layer comprise silicon germanium.

* * * * *